United States Patent
Mahajani et al.

(10) Patent No.: US 7,012,299 B2
(45) Date of Patent: Mar. 14, 2006

(54) STORAGE LAYER OPTIMIZATION OF A NONVOLATILE MEMORY DEVICE

(75) Inventors: Maitreyee Mahajani, Saratoga, CA (US); Andrew J. Walker, Mountain View, CA (US); En-Hsing Chen, Sunnyvale, CA (US)

(73) Assignee: Matrix Semiconductors, Inc., Santa Clara, CA (US)

( * ) Notice: Subject to any disclaimer, the term of this patent is extended or adjusted under 35 U.S.C. 154(b) by 82 days.

(21) Appl. No.: 10/668,693

(22) Filed: Sep. 23, 2003

(65) Prior Publication Data
US 2005/0062098 A1    Mar. 24, 2005

(51) Int. Cl.
*H01L 29/792* (2006.01)
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ............... 257/324; 257/325; 257/411; 438/216; 438/261

(58) Field of Classification Search ............... 257/324, 257/325, 411; 438/216, 261
See application file for complete search history.

(56) References Cited

U.S. PATENT DOCUMENTS

| | | | |
|---|---|---|---|
| 6,469,343 B1 * | 10/2002 | Miura et al. ............... | 257/324 |
| 6,605,839 B1 * | 8/2003 | Miura et al. ............... | 257/314 |
| 6,674,138 B1 * | 1/2004 | Halliyal et al. ............. | 257/411 |
| 6,677,640 B1 * | 1/2004 | Sandhu et al. .............. | 257/324 |
| 6,682,973 B1 * | 1/2004 | Paton et al. ................ | 438/240 |
| 6,797,604 B1 * | 9/2004 | Chan et al. ................. | 438/622 |
| 2002/0028541 A1 * | 3/2002 | Lee et al. ................... | 438/149 |

OTHER PUBLICATIONS

U.S. Appl. No. 10/270,127, filed Oct. 15, 2002, Mahajani et al.
Evtukh, A. A. ,et al. , "The Multilayer Silicon Nitride Films as a Media for Charge Storage in MNOS Structures", *1996 Int'l Nonvolatile Memory Technology Conference*, (Apr. 1996),pp. 91-93.
Govoreanu, B. ,et al. ,"VARIOT: A Novel Multilayer Tunnel Barrier Concept for Low-Voltage Nonvolatile Memory Devices", *IEEE Electron Device Letters, 2003*, (2003),pp. 1-3.

* cited by examiner

Primary Examiner—Nathan J. Flynn
Assistant Examiner—Victor A. Mandala, Jr.
(74) Attorney, Agent, or Firm—Matrix Semiconductor, Inc.; Pamela J. Squyres

(57) ABSTRACT

The traditional nitride-only charge storage layer of a SONOS device is replaced by a multifilm charge storage layer comprising more than one dielectric material. Examples of such a multifilm charge storage layer are alternating layers of silicon nitride and silicon dioxide, or alternating layers of silicon nitride and aluminum oxide. The use of more than one material introduces additional barriers to migration of charge carriers within the charge storage layer, and improves both endurance and retention of a SONOS-type memory cell comprising such a charge storage layer.

43 Claims, 4 Drawing Sheets

Prior Art

Prior Art

STORAGE LAYER OPTIMIZATION OF A NONVOLATILE MEMORY DEVICE

BACKGROUND OF THE INVENTION

One conventional type of nonvolatile memory cell is a SONOS device, which operates by trapping charge in a charge storage layer. The presence or absence of stored charge distinguishes a programmed cell from an unprogrammed cell.

Thus the ability of the cell to retain stored charge is crucial to its performance as a memory device. Stored charge tends to be lost from the cell over time and with successive write-erase cycles.

Attempts have been made to improve retention of charge by optimizing the characteristics of nitride (the material most frequently used for the charge storage layer), using oxynitride used instead of nitride, applying heat treatments to nitride, etc.

Some of these methods have shown some benefit, but there is a need to further improve retention and endurance of SONOS-type devices.

SUMMARY OF THE INVENTION

The present invention is defined by the following claims, and nothing in this section should be taken as a limitation on those claims. In general, the invention is directed to a method for improving retention of charge in a nonvolatile memory device that operates by storing charge.

A first aspect of the invention provides for a SONOS-type device comprising a tunneling dielectric, a dielectric charge storage layer in contact with the tunneling dielectric, the charge storage layer comprising a first dielectric film and a second dielectric film, wherein the first and the second dielectric films are formed of different materials; and a blocking dielectric in contact with the charge storage layer.

Another aspect of the invention provides for a SONOS-type device comprising a tunneling dielectric, a dielectric charge storage layer in contact with the tunneling dielectric, the charge storage layer comprising a first dielectric film and a second dielectric film, wherein at least one of the first dielectric film and the second dielectric film does not comprise silicon nitride; and a blocking dielectric in contact with the charge storage layer.

Yet another aspect of the invention provides for a SONOS-type device comprising a tunneling dielectric; a blocking dielectric; a first dielectric charge storage film in contact with the blocking dielectric comprising a first material; and a second dielectric charge storage film comprising a second material, the second charge storage film in contact with the first charge storage film, wherein the second material and the first material are not the same material, and wherein the first charge storage film and the second charge storage film are disposed between the tunneling dielectric and the blocking dielectric.

A preferred embodiment of the present invention provides for a SONOS-type device comprising a tunneling dielectric; a blocking dielectric; a first dielectric charge storage film disposed between the tunneling dielectric and the blocking dielectric; and a second dielectric charge storage film disposed between the tunneling dielectric and the blocking dielectric, wherein at least one of the first charge storage film and the second charge storage film does not comprise silicon nitride, and wherein no material disposed between the tunneling dielectric and the blocking dielectric is a conductor or a semiconductor.

A related embodiment provides for a method for making a SONOS-type memory cell, said method comprising the steps of forming a semiconductor channel; forming a tunneling dielectric; forming a blocking dielectric; forming a gate electrode; forming a first charge storage film between the tunneling dielectric and the blocking dielectric; and forming a second charge storage film in contact with the first charge storage film, wherein at least one of the first charge storage film and the second charge storage film is not silicon nitride; and wherein the first charge storage film is in contact with the blocking dielectric.

Still another embodiment of the invention provides for a memory array comprising a SONOS-type cell, said cell comprising a tunneling dielectric, a dielectric charge storage layer in contact with the tunneling dielectric, the charge storage layer comprising a first dielectric film and a second dielectric film, wherein the first and the second dielectric films are formed of different materials; and a blocking dielectric in contact with the charge storage layer, wherein the array is a nonvolatile memory array.

A related embodiment provides for a monolithic three-dimensional memory array comprising a plurality of SONOS-type memory cells, each cell comprising a tunneling dielectric, a dielectric charge storage layer in contact with the tunneling dielectric, the charge storage layer comprising a first dielectric film and a second dielectric film, wherein at least one of the first dielectric film and the second dielectric film does not comprise silicon nitride; and a blocking dielectric in contact with the charge storage layer, wherein the memory array comprises at least two levels of SONOS-type memory cells, one level formed vertically over the other.

A different aspect of the invention provides for a memory cell comprising a channel region; and a tunneling oxide grown by an in situ steam generation process, the tunneling oxide in contact with the channel, wherein the memory cell is a portion of a monolithic three dimensional memory array comprising at least two levels of memory cells, one level formed vertically over the other.

Each of the aspects and embodiments of the invention can be used alone or in combination with one another.

The preferred aspects and embodiments will now be described with reference to the attached drawings.

DETAILED DESCRIPTION OF THE INVENTION

Figure 1A:
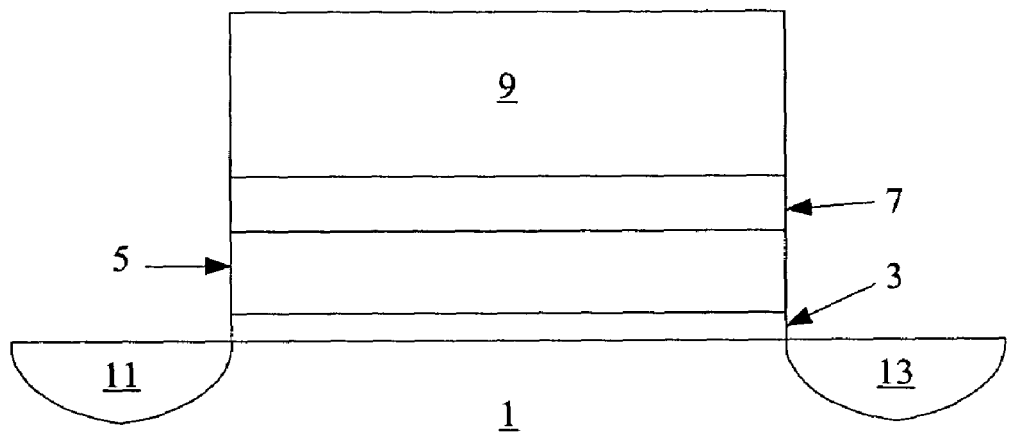
FIGS. 1a, 1b, and 1c are cross-sectional views showing structure and operation of a traditional SONOS cell.

The present invention is an improved nonvolatile charge-storage memory cell related to a traditional SONOS device. A SONOS device, as shown in FIG. 1a, is a field effect transistor that operates as a nonvolatile memory cell by storing charge. A typical SONOS device is formed on a substrate 1 (conventionally a monocrystalline silicon wafer), upon which is formed a tunneling oxide 3 (normally silicon dioxide), a charge storage layer 5 (normally silicon nitride), a blocking oxide 7 (normally silicon dioxide), and a gate electrode 9 (typically of polycrystalline silicon, herein called polysilicon.) The silicon-oxide-nitride-oxide-silicon stack of substrate 1, tunneling oxide 3, charge storage layer 5, blocking oxide 7, and gate electrode 9 gives the SONOS device its name. Source region 11 and drain region 13 are formed in the substrate, for example by ion implantation.

Figure 1B:
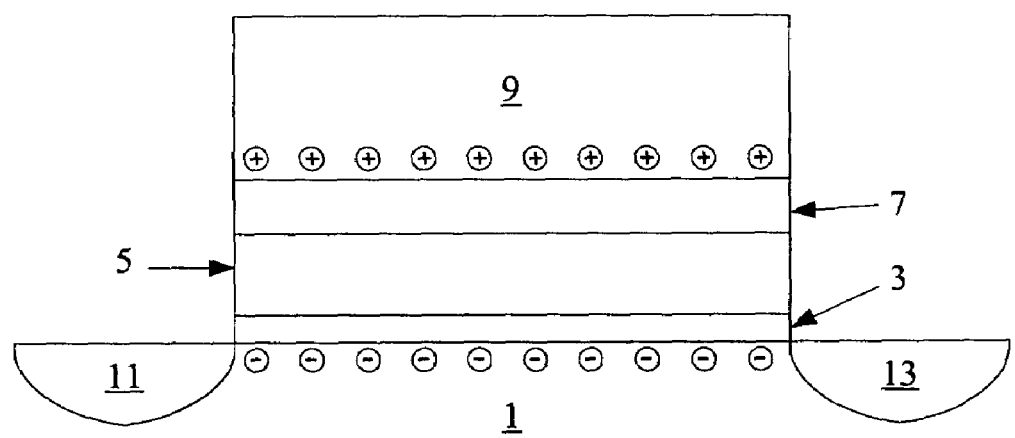

Turning to FIG. 1b, in normal operation of, for example, a NMOS device, a positive charge is applied to gate electrode 9. The excess of positive charge in gate electrode 9 (positive charge carriers indicated by a "+" in a circle) attracts electrons (indicated by a "−" in a circle) in silicon substrate 1. When enough charge is applied, the threshold voltage $V_T$ is reached, and a conductive channel region forms in substrate 1; at this point the transistor is considered to be "on," or conducting between source and drain.

Figure 1C:
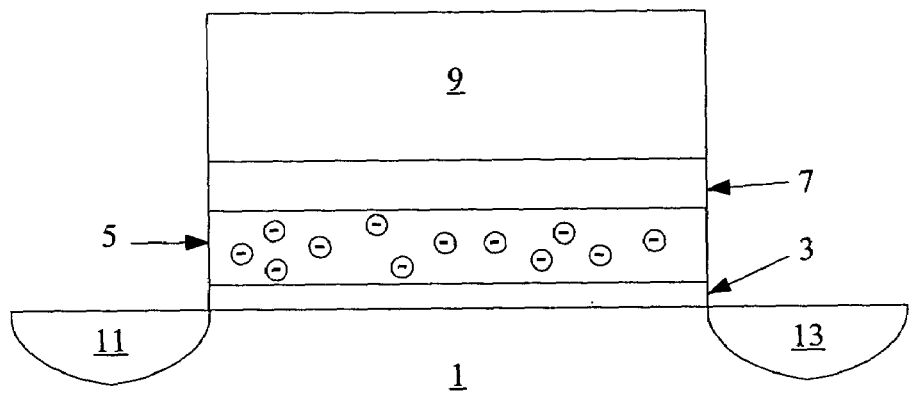

With sufficient positive charge applied to gate electrode 9, some electrons from substrate 1, attracted to the positive charge on gate electrode 9, will tunnel through very thin tunneling oxide 3, and will be trapped in charge storage layer 5, as in FIG. 1c. When the positive charge is no longer applied to gate electrode 9, these electrons remain trapped in charge storage layer 5. In SONOS devices silicon nitride ($Si_3N_4$) is typically used for charge storage layer 5 because it tends to have "traps," or flaws in the crystal lattice which are low-energy sites, attracting free electrons and tending to hold them in place. The presence or absence of trapped charge in charge storage layer 5 can be sensed, and distinguishes a programmed cell from an unprogrammed cell. (For simplicity, this example described the operation and structure of an NMOS device, in which the source and drain are heavily doped n-type silicon and the substrate is lightly doped p-type. Those skilled in the art will appreciate that a PMOS example could have been given instead.)

Figure 2:
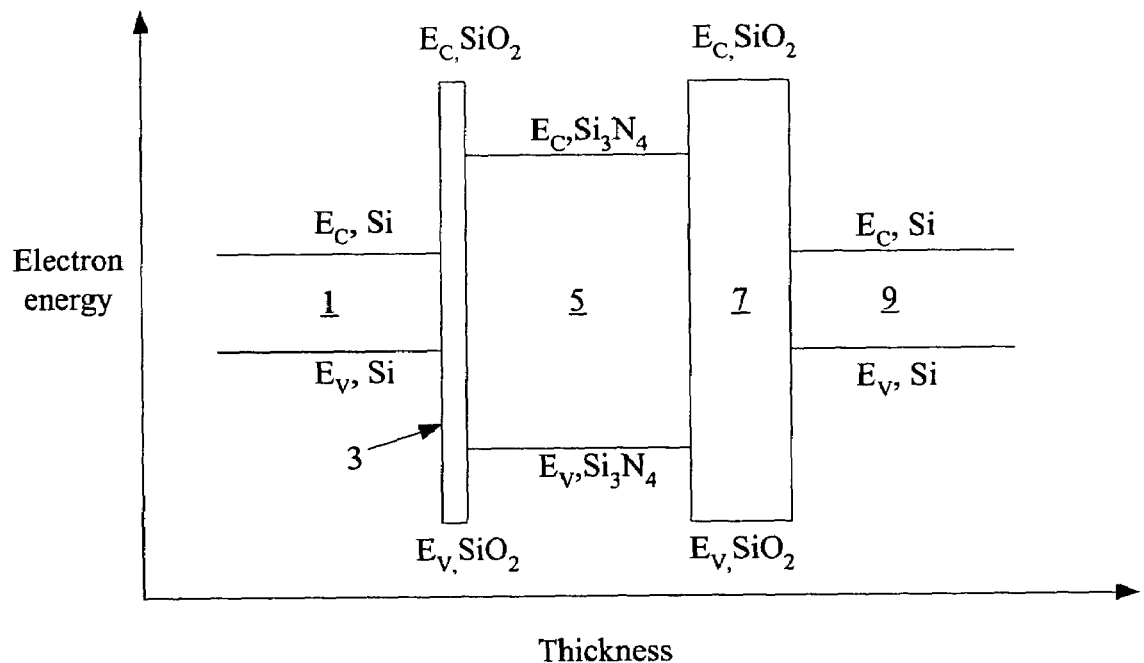
FIG. 2 is an energy band diagram of the SONOS cell of FIGS. 1a, 1b, and 1c.

The energy required for a charge carrier to move from one layer to the next is illustrated in FIG. 2, an energy band diagram of the SONOS device of FIGS. 1a, 1b, and 1c. Layer thickness increases on the X-axis, and electron energy increases (and hole energy decreases) on the Y-axis. FIG. 2 depicts the energy gap between the valence band edge ($E_V$) and the conduction band edge ($E_C$) for each material. The gap between $E_V$, Si and $E_C$, Si for silicon substrate 1 is 1.1 eV. The gap between $E_V$, $SiO_2$ and $E_C$, $SiO_2$, for silicon dioxide tunneling oxide 3 is about 8 eV. The gap between $E_V$, $Si_3N_4$ and $E_C$, $Si_3N_4$ silicon nitride charge storage layer 5 is about 5.1 eV. The $E_V$, $SiO_2$–$E_C$, $SiO_2$ gap for silicon dioxide blocking oxide 7 is about 8 eV. The $E_V$, Si–$E_C$, Si gap for polysilicon gate electrode 9 is 1.1 eV. The large energy difference between $E_C$, Si of substrate 1 and $E_C$, $SiO_2$ of tunneling oxide 3 (this gap is 3.1 eV) makes tunneling oxide 3 an effective barrier to electron flow. When charge is applied, these barriers are artificially lowered and electrons are able to move. For example, with no charge applied, an electron in substrate 1 is prevented from reaching charge storage layer 5 by tunneling oxide 3. With charge applied, the barrier is effectively lowered, allowing electron flow to charge storage layer 5. With charge removed, the barrier is back in place, and the electron is trapped in charge storage layer 5 by the gap between $E_C$, $Si_3N_4$ of charge storage layer 5 and $E_C$, $SiO_2$ of tunneling oxide 3 or blocking oxide 7 (this gap is 1.05 eV).

Note that for simplicity, the preceding description speaks of electron flow. It will be understood that holes flow as well, and the more general term "charge carrier" can be used instead, and that different charge polarities can be used.

In reality, however, retention (the ability to retain stored charge) in the charge storage layer of a SONOS memory cell is imperfect. To minimize the voltages required to operate the device, the tunneling oxide 3, charge storage layer 5, and blocking oxide 7 are formed as thin as possible. When charge carriers trapped in the charge storage layer 5 are exposed to any voltage, for example during reading of the cell, or when nearby cells are programmed or erased, the charge carriers will migrate within charge storage layer 5. If charge carriers migrate close to either tunneling oxide 3 or blocking oxide 7, there is some danger that over time they will escape: Tunneling oxide 3 is typically a high quality oxide, but is very thin, while blocking oxide 7, though thicker, is normally a lower quality oxide and will have flaws.

An aim of the present invention is to improve retention by introducing additional barriers to charge carrier migration within the charge storage layer. In one aspect of the invention, a SONOS-type device has superior retention by having a charge storage layer comprising more than one material. Embodiments of the present invention combine one or more silicon nitride films with one or more other dielectric films in the charge storage layer to provide additional barriers to prevent charge carriers from escaping. In other embodiments, silicon nitride may not be one of the dielectrics included in the charge storage layer.

For the purpose of this discussion, "SONOS-type device" will mean a field effect transistor comprising 1) a semiconductor channel region, 2) a tunneling dielectric in contact with the channel region, 3) a charge storage layer comprising only dielectric material in contact with the tunneling dielectric, 4) a blocking dielectric in contact with the charge storage layer, and 5) a gate electrode in contact with the blocking dielectric. It should be noted that the channel region is called a channel region because it is where a conductive channel will be formed when the transistor is on, but for purposes of this discussion will be called a channel region whether the transistor is on or off.

A traditional SONOS device is of course a SONOS-type device, but the term as used here is intended to be broader. In a SONOS-type device, the gate electrode need not be silicon; it can be either semiconductor or metal, for example, it may comprise tungsten. Similarly, any appropriate material can be used for the channel region. A SONOS-type device has layers having the same functions as the silicon channel region, gate oxide, nitride charge storage layer, blocking oxide, and silicon gate electrode of a traditional SONOS device, but one or more materials can be substituted for the material traditionally used for any of these layers. The device can be formed on a monocrystalline semiconductor substrate, or on a polysilicon substrate, as a thin film transistor (TFT) array. The gate electrode can be formed above the channel region or vice versa; ie the device can be "rightside-up" or "upside-down." (Examples of rightside-up and upside-down SONOS cells are found in co-pending U.S. application Ser. No. 10/079,472, filed on Feb. 19, 2002, by Maitreyee Mahajani et al., entitled "Gate Dielectric Structures for Integrated Circuits and Methods for Making and Using Such Gate Dielectric Structures," hereby incorporated by reference.) A SONOS-type device can operate either in enhancement mode or in depletion mode.

The charge storage layer in a SONOS-type device (and a traditional SONOS device) comprises only dielectric materials. This is in contrast with a floating-gate device, in which charge is stored in a conductive material, like polysilicon. In a SONOS-type device no material disposed between the tunneling dielectric and the blocking dielectric is a conductor or a semiconductor.

In aspects of the present invention, the charge storage layer, which in traditional SONOS devices is formed of a single layer of silicon nitride, is replaced with two or more films of different dielectric materials. The different materials have different energy band gaps, creating additional barriers to prevent charge carriers from escaping.

An example will be given of a SONOS-type device having a multi-film charge storage layer formed according to the present invention. Specific materials, numbers of layers, and thicknesses will be provided. It will be apparent to those skilled in the art, however, that these details are provided for clarity and completeness only, and other combinations of other dielectric materials can be structured in other arrangements while still falling within the scope of the invention.

Figure 3A:
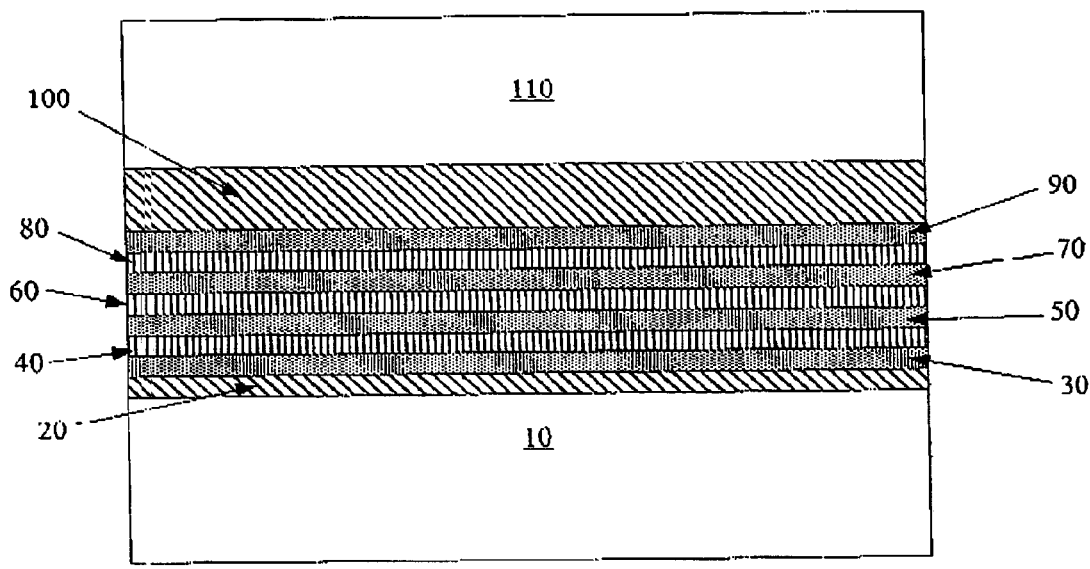
FIGS. 3a and 3b are cross-sectional views illustrating formation of a SONOS-type device according to the present invention.

The fabrication of one embodiment of a SONOS-type device formed according to the present invention will be described. Turning to FIG. 3a, fabrication starts with a substrate 10, for example a monocrystalline silicon wafer. Alternatively, a layer of polysilicon deposited over a dielectric can form the substrate as well, as it would for the formation of a TFT device. Once the SONOS-type device is formed, the substrate 10 will form the source, drain, and channel region of the transistor.

A tunneling dielectric 20 is formed on substrate 10. Tunneling dielectric 20 may be, for example, 15 to 30 angstroms of $SiO_2$, which can be grown or deposited using any conventional technique. Any of several techniques may be used, such as a Rapid Thermal Oxidation (RTO) in a pure oxygen environment, or in an oxygen environment diluted with nitrogen. Thermal oxidation in a furnace may also be employed to form tunneling dielectric 20.

Next a first dielectric film 30 composed of a first dielectric material, for example silicon nitride, is formed on and in contact with tunneling dielectric 20. Any conventional method can be used to form first dielectric film 30. First dielectric film 30 is preferably between about 10 and about 50 angstroms thick; more preferably about 30 angstroms thick. Any process can be used, but this layer is preferably produced using a low-pressure CVD (LPCVD) process between about 100 mTorr and about 700 mTorr. Silane or dichlorosilane (DCS) can be used as a source of silicon; preferably DCS is flowed at between about 10 and about 200 standard cubic centimeters per minute (sccm), preferably at about 50 sccm. $NH_3$ is flowed at between about 10 and about 300 sccm, preferably at about 150 sccm.

A second dielectric film 40 composed of a second dielectric material, for example silicon dioxide, is formed on and in contact with dielectric film 30 using any conventional method. For example, DCS is preferably flowed at between about 10 and about 200 sccm, preferably at about 15 sccm. NO or $N_2O$ is flowed at between about 10 and about 300 sccm, preferably at about 90 sccm. Second dielectric film 40 is preferably between about 10 and about 50 angstroms thick; more preferably about 30 angstroms thick.

In this preferred embodiment, films of silicon nitride alternate with films of silicon dioxide. Following formation of second dielectric film 40, third dielectric film 50 is formed on and in contact with second dielectric film 40. Fourth dielectric film 60, fifth dielectric film 70, sixth dielectric film 80, and seventh dielectric film 90 are formed in succession, each formed on and in contact with the previously formed film. Dielectric films 50, 70, and 90 are preferably formed of silicon nitride, and may be formed using the same materials and methods used in the formation of first dielectric film 30.

Intervening dielectric films 60 and 80 are preferably formed of silicon dioxide, according to the description of second dielectric film 40 above.

Blocking dielectric 100 is formed on and in contact with dielectric film 90. Blocking dielectric 100 is preferably a high temperature oxide (HTO) of silicon dioxide about 30 to about 200 angstroms thick, preferably about 50 angstroms thick, though other dielectrics, or oxides formed by other methods, can be used instead.

Doped polysilicon layer 110 is formed on and in contact with blocking dielectric 100. It can be deposited and doped by any method, including in situ doping or ion implantation. P-type or n-type dopants can be used.

Figure 3B:
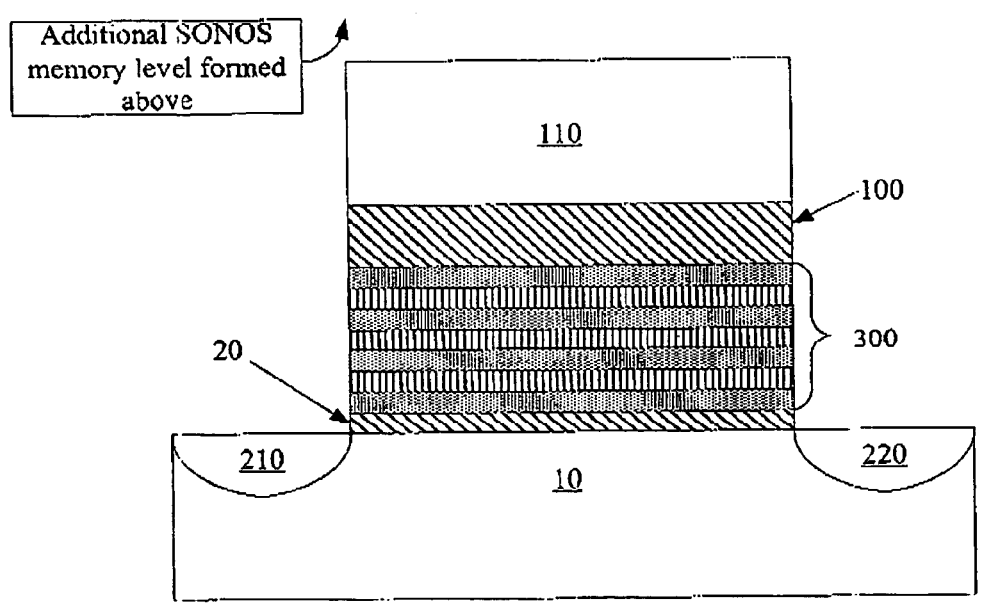

In this embodiment, polysilicon layer 110, blocking dielectric 100, dielectric films 90, 80, 70, 60, 50, 40, and 30, and tunneling dielectric 20 are patterned and etched, as shown in FIG. 3b, to form gate electrode 110, blocking dielectric 100, charge storage layer 300, and tunneling dielectric 20. Source and drain regions 210 and 220 are formed, for example by ion implantation. A channel region will exist in substrate 10.

Note that charge storage layer 300 comprises patterned films 30, 40, 50, 60, 70, 80, and 90. If desired, spacers can be formed by any conventional method.

In another alternative, tunneling oxide 20 in the structure just described can be formed by an in situ steam generation (ISSG) process, as described in Mahajani et al. For example, a monocrystalline silicon or polysilicon substrate can be exposed to such a process. The in situ steam generation process may be performed with the temperature between about 750 to about 1050 degrees Celsius and preferably is about 950 degrees Celsius. A suitable gas mixture is then introduced into the CVD apparatus and flowed over the substrate surface. A suitable gas mixture is any mixture containing oxygen and hydrogen, preferably introduced separately into the CVD chamber. Other inert or non-reactive gases (such as argon or helium) can be included in the gas mixture, but need not be present.

The flow rate of the oxygen and hydrogen in the ISSG process is optimized to obtain the desired growth of the oxide layer. In one embodiment, the oxygen flow rate can range from about 1 to about 5 liters/minute, preferably about 2–4 liters/minute, and more preferably about 3 liters/minute. The hydrogen flow rate can range from about 20 to about 1000 sccm (standard cubic centimeters/minute), preferably about 20 to about 100 sccm, and more preferably about 50 sccm.

This oxidation process is continued for a time sufficient to form a high-quality oxide layer with the desired thickness. In a preferred embodiment, the thickness of the oxide layer formed by the ISSG process can range from about 10 to about 200 angstroms, preferably about 10 to about 50 angstroms, and more preferably about 25 angstroms. As the deposition rate of the ISSG process described above can range from about 0.5 to about 2 angstroms/second, the time for the oxidation can range from about 10 seconds to about 60 seconds.

If desired, this oxidation process can be followed by an annealing process. Any suitable annealing process known in the art that maintains the quality of the oxide layer can be employed in the invention. In one embodiment, the annealing process is performed in a nitrogen and oxygen atmosphere, such as nitric oxide (NO), to form an oxynitride and improve the quality and reliability of the oxide layer.

Figure 4:
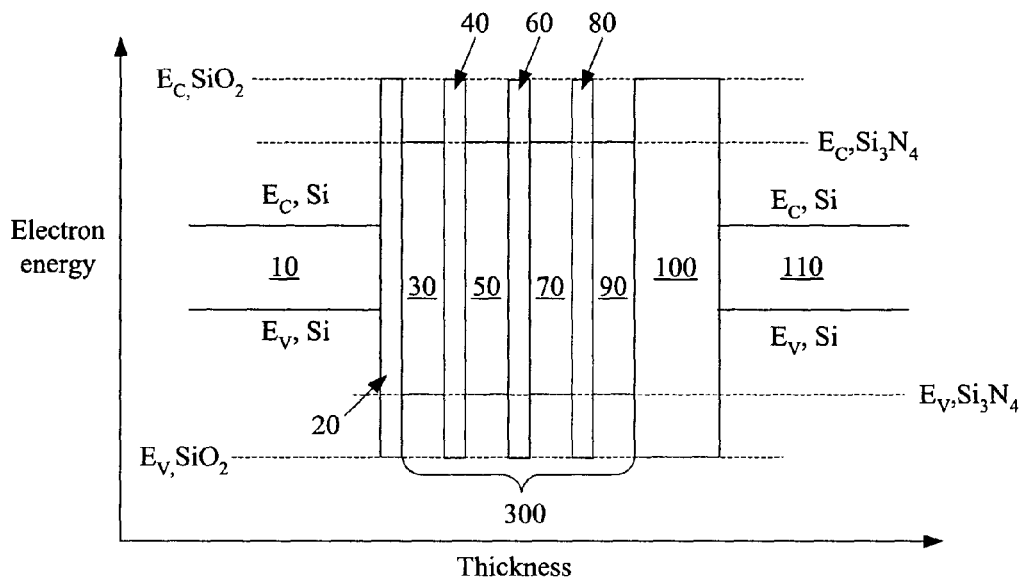
FIG. 4 is an energy band diagram of the SONOS-type device of FIGS. 3a and 3b.

FIG. 4 shows an energy band diagram of the SONOS-type device of FIG. 3b. It will be seen that the large energy gap between $E_C$, $SiO_2$ of dielectric films 40, 60, and 80, which are silicon dioxide in this embodiment, and $E_C$, $Si_3N_4$ of dielectric films 30, 50, 70, and 90, silicon nitride in this embodiment, provides an additional barrier to migration of charge carriers within charge storage layer 300 of FIG. 3b.

A SONOS-type device according to the present invention having a three-film charge storage layer (silicon oxynitride, silicon-rich silicon nitride, and silicon oxynitride) has shown substantial improvement in retention over an analogous device with a silicon nitride-only charge storage layer. A SONOS device with a silicon nitride-only charge storage layer was built, and retention was measured and extrapolated to ten years. On initial programming, a cell that has been previously exposed to 100,000 write-erase cycles has a window between programmed $V_T$ and erased $V_T$ of about 2 volts. The ten-year extrapolation shows that trapped charge carriers escape and no discernable window between programmed $V_T$ and erased $V_T$ remains. In contrast, retention was measured and extrapolated for an analogous SONOS-type device with the three-film charge storage layer described above. Even for a cell previously exposed to a million write-erase cycles, the initial 3 volt window between programmed $V_T$ and erased $V_T$ after an extrapolated ten year span has only shrunk to 1.5 volts; this difference is still detectable, and the cell can still operate as a memory cell.

A multifilm charge storage layer according to the present invention improves not only retention but also endurance of a SONOS-type device. Endurance is the ability of a rewritable memory cell to retain the distinction between its programmed and unprogrammed state, and is generally expressed in numbers of write-erase cycles. In the industry it is typical for design specifications for rewritable memories to require them to be able to survive about one million write-erase cycles and still be readable.

Figure 5:
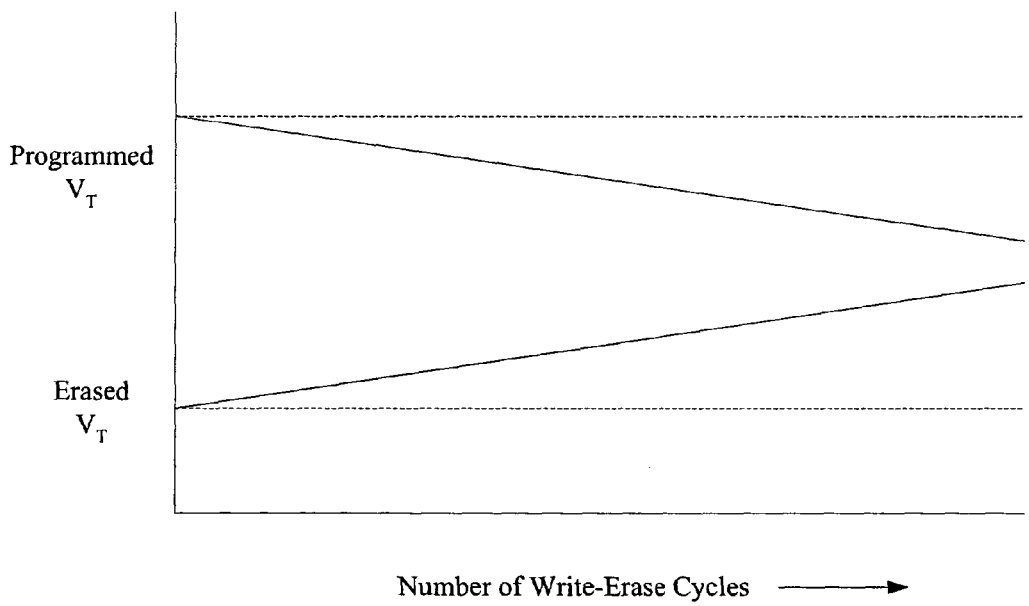
FIG. 5 is an example endurance graph illustrating loss of readability of a SONOS device with increasing write-erase cycles.

It will be recalled that the presence or absence of stored charge distinguishes a programmed cell from an unprogrammed or erased cell. The stored charge changes the threshold voltage $V_T$ required to turn the transistor on. The difference between programmed $V_T$ and erased $V_T$ must be large enough to be distinguishable and predictable from one cell to the next. FIG. 5 illustrates theoretical programmed and erased $V_T$ for a cell (theoretical values indicated by dashed lines) as compared to measured values after the cell is exposed to increasing numbers of write-erase cycles. Over many write-erase cycles, programmed and erased $V_T$ tend to converge, until the programmed and erased states are no longer reliably distinguishable. (As FIG. 5 is intended to illustrate trends for a typical cell only, rather than an actual cell, no voltage numbers or numbers of cycles are provided on the axes.)

A SONOS-type device with the three-film charge storage layer (silicon oxynitride, silicon-rich silicon nitride, and silicon oxynitride) described earlier also showed improvement in endurance when compared to a SONOS device with a conventional silicon nitride-only charge storage layer. For the device with that three-film charge storage layer, no convergence between programmed $V_T$ and erased $V_T$ was observable after one million write-erase cycles. For a comparable device with a silicon nitride-only charge storage layer, convergence of programmed and erased $V_T$ was apparent after only 100,000 write-erase cycles.

It is believed that one reason for a memory cell to become unreadable over time may be that cumulative damage to the silicon nitride of the charge storage layer may cause charge carriers to become too mobile within the layer, allowing them to escape. A SONOS-type device with a multifilm charge storage layer according to the present invention may have improved endurance because decreased migration of charge carriers within the charge storage layer causes the charge storage layer to suffer less damage.

An approach with an apparently similar motivation for improving retention of the charge storage layer has been tried in Evtukh et al., "The Multilayer Silicon Nitride Films as a Media for Charge Storage in MNOS Structures," from proceedings of the 1996 International Nonvolatile Memory Technology Conference. In the method of Evtukh et al., a charge storage layer is created using silicon nitride with varying stoichiometry; ie. in which the ratio of silicon to nitrogen is varied across the charge storage layer. This approach differs from the present invention, however, in that in the device of Evtukh et al., only silicon nitride is used in the charge storage layer, while most aspects of the present invention call for at least one dielectric material in the charge storage layer which is not silicon nitride. (Aspects of the present invention providing for a monolithic three dimensional memory array comprising SONOS-type devices having tunneling oxide formed using an in situ steam generation process, however, may have nitride-only charge storage layers.)

It will be understood by those skilled in the art that while the detailed example given of a SONOS-type device with a multifilm charge storage layer, the layer including four silicon nitride films alternating with silicon dioxide films, this is simply an example, and many other configurations and materials according to the present invention will provide benefit. A SONOS-type device according to the present invention may have, for example, a charge storage layer comprising, in order and in contact with each other: a silicon nitride film, an aluminum oxide film, and another silicon nitride film.

Many other configurations, using many other dielectric materials, can be envisioned. In addition to those materials already mentioned, preferred dielectric materials for use in a multifilm charge storage layer according to the present invention are oxides such as hafnium oxide, zirconium oxide, tantalum pentoxide, yttrium oxide, calcium oxide, magnesium oxide, etc., or, alternatively, oxynitrides, for example. These films may be stoichiometric or nonstoichiometric. Any appropriate dielectric material can be used, however, preferred materials have a dielectric constant greater than or equal to 3.9; more preferred materials have a dielectric constant greater than or equal to about 7. In some devices according to the present invention, it may be preferred to use materials having a dielectric constant greater than about 25.

Any SONOS-type device having a charge storage layer (formed between a blocking dielectric and a tunneling dielectric) comprising two or more dielectric films, wherein in the dielectric films are different materials, falls within the scope of the invention. "Different materials" means having different chemical components; the regions with varying different stochiometry in the all-silicon nitride charge storage layers of Evtukh et al., for example, have different ratios of silicon and nitrogen, but are all silicon nitride, $Si_xN_y$. In multi film charge storage layers in most aspects of the present invention, one of the component films is not silicon nitride; in many embodiments, none of the component films is silicon nitride. Preferably the charge storage layer is between about 30 and about 200 angstroms thick. Each dielectric film in the charge storage layer is preferably between about 10 and about 190 angstroms thick.

Monolithic three dimensional memory arrays having rewritable memory cells are described in Lee et al., U.S. patent application Ser. No. 09/927,648, "Dense Arrays and Charge Storage Devices, and Methods for Making Same,"

filed Aug. 13, 2001; Walker et al., U.S. application Ser. No. 10/335,089, "Method for Fabricating Programmable Memory Array Structures Incorporating. Series-Connected Transistor Strings," filed Dec. 31, 2002; and Scheuerlein et al., U.S. application Ser. No. 10/335,078, "Programmable Memory Array Structure Incorporating Series-Connected Transistor Strings and Methods for Fabrication and Operation of Same," filed Dec. 31, 2002, all assigned to the assignee of the present invention and hereby incorporated by reference.

A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The SONOS-type device of the present invention having a multifilm charge storage layer can be used to advantage in a memory array fabricated in, for example, monocrystalline silicon substrate, or in polysilicon, as a TFT array. More specifically, the device of the present invention can advantageously be used in any of the monolithic three dimensional memory arrays using charge-storage memory cells cited above. In these memory arrays, each memory cell is a portion of a monolithic three dimensional memory array comprising at least two levels of SONOS-type memory cells, one level formed vertically over the other. Similarly, any of these memory arrays may benefit from the use of a tunneling oxide created by an in situ steam generation process. These methods can be used together or separately.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A SONOS-type device comprising:
   a tunneling dielectric,
   a dielectric charge storage layer in contact with the tunneling dielectric, the charge storage layer comprising a first dielectric film and a second dielectric film, wherein the first and the second dielectric films are formed of different materials;
   a blocking dielectric in contact with the charge storage layer; and
   a semiconductor channel region in contact with the tunneling dielectric,
   wherein the semiconductor channel region comprises polysilicon.

2. The SONOS-type device of claim 1 wherein the first or the second dielectric film comprises a dielectric material with a dielectric constant greater than or equal to 3.9.

3. The SONOS-type device of claim 1 wherein the first dielectric film comprises silicon nitride, silicon dioxide, hafnium oxide, aluminum oxide, zirconium oxide, or tantalum pentoxide.

4. The SONOS-type device of claim 3 wherein the first dielectric film comprises silicon nitride and the second dielectric film comprises silicon dioxide.

5. The SONOS device of claim 1 wherein the charge storage layer further comprises a third dielectric film.

6. The SONOS-type device of claim 5 wherein the first dielectric film and the third dielectric film are formed of the same material, and the second dielectric film is interposed between the first and third dielectric films.

7. The SONOS-type device of claim 1 further comprising a gate electrode in contact with the blocking dielectric.

8. The SONOS-type device of claim 7 wherein the gate electrode comprises polysilicon.

9. The SONOS-type device of claim 7 wherein the gate electrode comprises tungsten.

10. The SONOS-type device of claim 7 wherein the device is a portion of a memory array.

11. The SONOS-type device of claim 10 wherein the memory array is a monolithic three dimensional memory array.

12. The SONOS-type device of claim 1 wherein the device is a portion of a memory array.

13. The SONOS-type device of claim 12 wherein the memory array is a monolithic three dimensional memory array.

14. The SONOS-type device of claim 1 wherein the charge storage layer is between about 30 and about 200 angstroms thick.

15. A SONOS-type device comprising:
   a tunneling dielectric,
   a dielectric charge star layer in contact with the tunneling dielectric, the charge storage layer comprising a first dielectric film and a second dielectric film, wherein at least one of the first dielectric film and the second dielectric film does not comprise silicon nitride;
   a blocking dielectric in contact with the charge storage layer; and
   a semiconductor channel region in contact with the tunneling dielectric,
   wherein the channel region comprises polysilicon,
   wherein the device is a portion of a monolithic three dimensional memory array.

16. The SONOS-type device of claim 15 wherein the first dielectric film does not comprise silicon nitride.

17. The SONOS-type device of claim 16 wherein the first dielectric film comprises a dielectric material with a dielectric constant greater than or equal to 3.9.

18. The SONOS-type device of claim 17 wherein the first dielectric film comprises hafnium oxide, aluminum oxide, zirconium oxide, or tantalum pentoxide.

19. The SONOS-type device of claim 18 wherein the second dielectric film comprises silicon nitride.

20. The SONOS-type device of claim 15 further comprising a gate electrode in contact with the blocking dielectric.

21. The SONOS-type device of claim 20 wherein the gate electrode comprises polysilicon.

22. The SONOS-type device of claim 20 wherein the gate electrode comprises tungsten.

23. A SONOS-type device comprising:
   a tunneling dielectric;
   a blocking dielectric;
   a first dielectric charge storage film in contact with the blocking dielectric comprising a first material; and
   a second dielectric charge storage film comprising a second material, the second charge storage film in contact with the first charge storage film,
   wherein the second material and the first material are not the same material, and wherein the first charge storage film and the second charge storage film are disposed between the tunneling dielectric and the blocking dielectric,
   wherein the SONOS-type device is a TFT device.

24. The SONOS-type device of claim 23 wherein the first material comprises a dielectric material with a dielectric constant greater than or equal to 3.9.

25. The SONOS-type device of claim 24 wherein the first material is silicon nitride, silicon dioxide, hafnium oxide, aluminum oxide, zirconium oxide, or tantalum pentoxide.

26. The SONOS-type device of claim 25 further comprising a third charge storage film in contact with the second charge storage film.

27. The SONOS-type device of claim 26 further comprising a fourth charge storage film in contact with the third charge storage film, the first and third charge storage films comprising the first material, and the second and fourth charge storage films comprising the second material.

28. A SONOS-type device comprising:
   a tunneling dielectric;
   a blocking dielectric;
   a first dielectric charge storage film disposed between the tunneling dielectric and the blocking dielectric; and
   a second dielectric charge storage film disposed between the tunneling dielectric and the blocking dielectric,
   wherein at least one of the first charge storage film and the second charge storage film does not comprise silicon nitride,
   wherein no material disposed between the tunneling dielectric and the blocking dielectric is a conductor or a semiconductor; and
   a channel region in contact with the tunneling dielectric, wherein the channel region is polysilicon.

29. The SONOS-type device of claim 28 further comprising a gate electrode in contact with the blocking dielectric.

30. The SONOS-type device of claim 29 wherein the gate electrode is above the channel region.

31. The SONOS-type device of claim 28 further comprising a gate electrode in contact with the blocking dielectric.

32. The SONOS-type device of claim 28 wherein:
   the first charge storage film is a first material,
   the second charge storage film is a second material,
   and the first material and the second material are not the same material.

33. The SONOS-type device of claim 28 wherein the first material is a dielectric material with a dielectric constant greater than or equal to 3.9.

34. The SONOS-type device of claim 33 wherein the first material is hafnium oxide, aluminum oxide, zirconium oxide, or tantalum pentoxide.

35. A method for making a SONOS-type memory cell, said method comprising the steps of:
   depositing a polycrystalline semiconductor channel region;
   forming a tunneling dielectric;
   forming a blocking dielectric;
   forming a gate electrode;
   forming a first charge storage film between the tunneling dielectric and the blocking dielectric; and
   forming a second charge storage film in contact with the first charge storage film, wherein at least one of the first charge storage film and the second charge storage film is not silicon nitride; and
   wherein the first charge storage film is in contact with the blocking dielectric,
   wherein the memory array is a monolithic three dimensional memory.

36. The method of claim 35 wherein the channel region is over the gate electrode.

37. The method of claim 35 wherein the gate electrode is over the channel region.

38. The method of claim 35 wherein the SONOS-type memory cell is a portion of a memory array.

39. The method of claim 35 wherein the first charge storage film or the second charge storage film is between about 10 and about 190 angstroms thick.

40. A monolithic three-dimensional memory array comprising a plurality of SONOS-type memory cells, each cell comprising:
   a tunneling dielectric,
   a dielectric charge storage layer in contact with the tunneling dielectric, the charge storage layer comprising a first dielectric film and a second dielectric film, wherein at least one of the first dielectric film and the second dielectric film does not comprise silicon nitride; and
   a blocking dielectric in contact with the charge storage layer,
   wherein the memory array comprises at least two levels of SONOS-type memory cells, one level formed vertically over the other.

41. A memory cell comprising: a channel region; and a tunneling oxide grown by an in situ steam generation process, the tunneling oxide in contact with the channel region, wherein the memory cell is a portion of a monolithic three dimensional memory array comprising at least two levels of memory cells, one level formed vertically over the other, further comprising a blocking oxide; and a dielectric charge storage layer in contact with the blocking oxide and the tunneling oxide, wherein the dielectric charge storage layer comprises a first dielectric charge storage film comprising a first material; and a second dielectric charge storage film comprising a second material, wherein the first material and the second material are not the same material.

42. The memory cell of claim 41 wherein the first material is silicon nitride, silicon dioxide, hafnium oxide, aluminum oxide, zirconium oxide, or tantalum pentoxide.

43. The memory cell of claim 41 wherein the in situ steam generation process is performed at a temperature of between about 750 degrees Celsius and about 1050 degrees Celsius.

* * * * *